US009515165B1

(12) United States Patent
Cheng et al.

(10) Patent No.: US 9,515,165 B1
(45) Date of Patent: Dec. 6, 2016

(54) III-V FIELD EFFECT TRANSISTOR (FET) WITH REDUCED SHORT CHANNEL LEAKAGE, INTEGRATED CIRCUIT (IC) CHIP AND METHOD OF MANUFACTURE

(71) Applicant: International Business Machines Corporation, Armonk, NY (US)

(72) Inventors: Cheng-Wei Cheng, White Plains, NY (US); Pranita Kerber, Mount Kisco, NY (US); Effendi Leobandung, Stormville, NY (US); Amlan Majumdar, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/850,954

(22) Filed: Sep. 11, 2015

(51) Int. Cl.
*H01L 29/66* (2006.01)
*H01L 29/78* (2006.01)
*H01L 29/205* (2006.01)

(52) U.S. Cl.
CPC ....... *H01L 29/66636* (2013.01); *H01L 29/205* (2013.01); *H01L 29/78* (2013.01)

(58) Field of Classification Search
CPC   H01L 29/66636; H01L 29/205; H01L 29/78
USPC ....................................................... 257/192
See application file for complete search history.

(56) References Cited

U.S. PATENT DOCUMENTS

| 6,943,407 | B2 | 9/2005 | Ouyang et al. |
| 7,368,358 | B2 | 5/2008 | Ouyang et al. |
| 7,615,829 | B2 | 11/2009 | Lochtefeld et al. |
| 8,669,591 | B2 | 3/2014 | Marino et al. |
| 2009/0108308 | A1* | 4/2009 | Yang .......... H01L 29/7848 257/288 |
| 2011/0147798 | A1 | 6/2011 | Radosavljevic et al. |
| 2011/0272739 | A1* | 11/2011 | Lee ............ H01L 29/66795 257/192 |

FOREIGN PATENT DOCUMENTS

JP    3058262    7/2000
TW    201131761    9/2011

* cited by examiner

*Primary Examiner* — Tu-Tu Ho
(74) *Attorney, Agent, or Firm* — Law Office of Charles W. Peterson, Jr.; Louis J. Percello, Esq.

(57) ABSTRACT

Field Effect Transistors (FETs), Integrated Circuit (IC) chips including the FETs, and a method of forming the FETs and IC. FET locations are defined on a layered semiconductor wafer. The layered semiconductor wafer preferably includes a III-V semiconductor surface layer and a buried layer. A gate stack is formed on each FET location. Source/drain regions are sub-etched at each said gate stack. The sub-etched source/drain regions define a channel under each said gate stack. A layered source/drain is formed in each sub-etched source/drain region.

20 Claims, 4 Drawing Sheets

III-V FIELD EFFECT TRANSISTOR (FET) WITH REDUCED SHORT CHANNEL LEAKAGE, INTEGRATED CIRCUIT (IC) CHIP AND METHOD OF MANUFACTURE

BACKGROUND OF THE INVENTION

Field of the Invention

The present invention generally relates to III-V semiconductor Field Effect Transistor (FET) manufacture and more particularly to improving yield and reliability in III-V semiconductor chip manufacture.

Background Description

Semiconductor technology and chip manufacturing advances have resulted in a steady decrease of chip feature size to increase on-chip circuit switching frequency (circuit performance) and the number of transistors (circuit density). Shrinking/reducing device or field effect transistor (FET) feature sizes and, correspondingly, device minimum dimensions, including horizontal dimensions (e.g., minimum channel length) and vertical dimensions (e.g., channel layer depth, gate dielectric thickness, junction depths and etc.), shrinks device size for increased device density and device performance. Device operating conditions including supply voltages and voltage swings reduce correspondingly as chip and device shrink. Generally, all other factors being constant, the active power consumed by a given unit increases linearly with switching frequency, i.e., performance. Thus, notwithstanding the decrease of chip supply voltage, chip power consumption has increased as features shrink and performance improves. Both at the chip and system levels, cooling and packaging costs have escalated as a natural result of this increase in chip power. For low end systems (e.g., handhelds, portable and mobile systems), where battery life is crucial, reducing net power consumption is important but, such a power reduction must come without degrading chip/circuit performance below acceptable levels.

Thus, to minimize semiconductor circuit power consumption, most integrated circuits (ICs) are made in the well-known complementary insulated gate FET technology known as CMOS. A typical CMOS circuit includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting, the other device (the PFET) is off, not conducting and, vice versa. An ideal on device may be modeled simply as a closed switch and an ideal off device may be modeled as an open switch. Thus, for ideal devices there is no static or DC current path in a typical CMOS circuit. Also, an ideal CMOS circuit consumes no static or DC power, consuming only transient power from charging and discharging purely capacitive loads.

For example, a CMOS inverter is a series connected PFET and NFET pair connected between a power supply voltage (Vdd) and supply return or ground (GND). Both devices are gated by the same input and both drive the same output. The PFET pulls the output high and the NFET pulls the output low at opposite input signal states. Ideally, when the gate of a NFET is below some positive threshold voltage ($V_T$) with respect to its source, the NFET is off, i.e., the switch is open. Above $V_T$, the NFET is on conducting current ($I_{on}$), i.e., the switch is closed. Similarly, a PFET is off ($I_{off}=0$) when its gate is above its $V_T$, i.e., less negative, and on below $V_T$. Thus, ideally, the CMOS inverter in particular and CMOS circuits in general pass no static (DC) current. So, ideally, device on to off current ratios ($I_{on}/I_{off}$) are very large and, ideal CMOS circuits use no static or DC power, consuming only transient power from charging and discharging capacitive loads. In practice, however, typical FETs are much more complex than switches with inherent current path resistances and various parasitic leakage currents.

Consequently, transient power for charging and discharging circuit loads accounts for only a portion (albeit a major portion) of CMOS chip power consumption. FET drain to source current is unidirectional current and so, consumes static or DC power, and depends upon circuit conditions and device transient voltages. Inherent current path resistances, e.g., source/drain and contact resistance, tend to limit drive current and add stage delays, all of which impairs performance.

Also, since device $V_T$ is directly proportional to gate dielectric thickness, as FET features (including gate dielectric thickness) shrink, these shorter, lower $V_T$ FETs conduct parasitic off currents including what is known as subthreshold current, i.e., when the device gate biases are such that the devices are off. Moreover, for a particular device, subthreshold current increases exponentially with the magnitude of the device's drain to source voltage ($V_{ds}$) and reduces exponentially with the magnitude of the device's $V_T$. When multiplied by the millions and even billions of devices on a state of the art SRAM, even 100 picoAmps (100 pA) of leakage in each of a million cells, for example, results in chip leakage on the order of 100 milliAmps (100 mA). Thus, as chip features have shrunk, these leakage sources have become more prominent.

While especially for complex chips and arrays with a large number of devices, device leakage (both gate and subthreshold) chip leakage power can be overwhelming, leakage reduction techniques have been equally unpalatable. So unfortunately, especially for III-V semiconductor chip fabrication, leakage and gate dielectric limits have become constraints on circuit performance and chip density.

Thus, there exists a need for improved sub-threshold leakage and reduced contact resistance in semiconductor chips, and more particularly for manufacturing III-V semiconductor chips with low sub-threshold leakage and low source/drain resistance.

SUMMARY OF THE INVENTION

An aspect of the invention is improved III-V semiconductor device sub-threshold leakage;

Another aspect of the invention is improved low sub-threshold leakage in low source/drain resistance III-V semiconductor devices;

Yet another aspect of the invention is improved III-V semiconductor device sub-threshold leakage in III-V semiconductor devices without increasing source/drain resistance.

The present invention relates to Field Effect Transistors (FETs), Integrated Circuit (IC) chips including the FETs, and a method of forming the FETs and IC. FET locations are defined on a layered semiconductor wafer. The layered semiconductor wafer preferably includes a III-V semiconductor surface layer and a buried layer. A gate stack is formed on each FET location. Source/drain regions are sub-etched at each said gate stack. The sub-etched source/drain regions define a channel under each said gate stack. A layered source/drain is formed in each sub-etched source/drain region.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
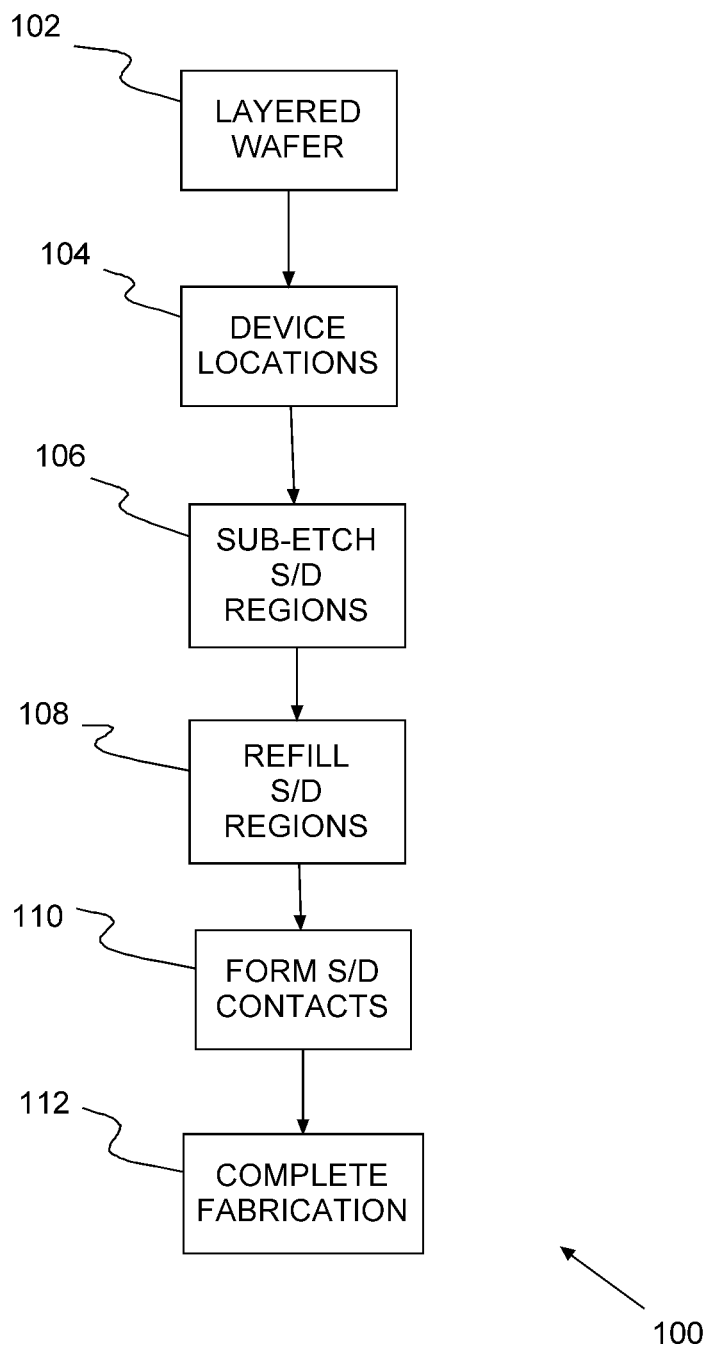
FIG. 1 shows an example of steps in a method for forming III-V semiconductor Field Effect Transistors (FETs) or devices with reduced subthreshold leakage according to a preferred embodiment of the present invention.

Turning now to the drawings and, more particularly, FIG. 1 shows an example of steps in a method 100 for forming III-V semiconductor Field Effect Transistors (FETs) or devices with reduced subthreshold leakage without increasing source/drain resistance according to a preferred embodiment of the present invention. In particular, preferred FETs include layered, raised source/drain regions that reduce subthreshold leakage with self-aligned contacts for low source/drain resistance.

Fabrication begins 102 with a layered wafer and defining 104 device locations on the wafer. Locations may be defined by forming FET gates on the wafer and isolating the device locations in the surface layer to define source/drain regions. The source/drain regions are sub-etched 106 to remove an upper portion of the surface layer at both ends of the FET channel. Semiconductor is regrown 108 to refill the sub-etched source/drain regions. Raised source/drains are formed with additional layers grown on the surface of the refill to complete the layered source/drain regions. Contacts are formed 110 self-aligned to the layered source/drain regions. Finally, normal IC chip fabrication resumes 112, connecting devices together to form circuits and wiring circuits together to form chips.

Figure 2:
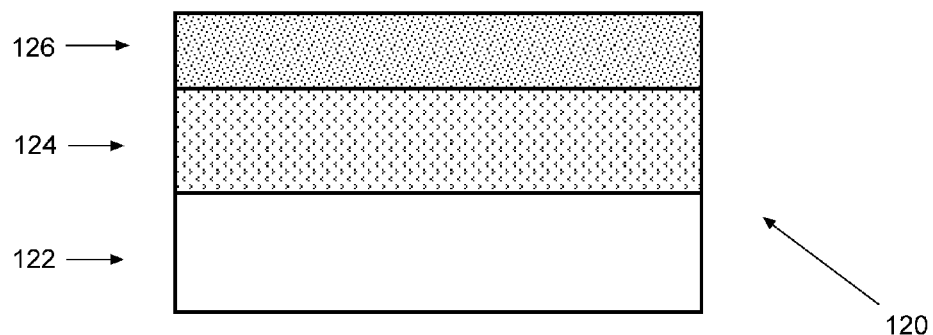
FIG. 2 shows a cross sectional example of a preferred layered wafer.

FIG. 2 shows a cross sectional example of a preferred layered wafer 120. In this example, the layered wafer 120 includes a substrate layer 122, a III-V bottom barrier layer 124 on the substrate layer 122, and a III-V channel layer 126 on the III-V bottom barrier layer 124. Preferably, the substrate layer 122 is a layer of indium phosphide (InP) grown on a silicon (Si) wafer or InP bonded to an insulator layer atop a Si wafer (such as, silicon dioxide on Si), and the III-V bottom barrier layer 124 is a layer of indium aluminum arsenide (InAlAs). The InAlAs bottom barrier layer 124 may be 10-200 nm thick, preferably, 50 nm thick, and provides an effective barrier for the subsequently formed source/drain heterojunctions. The III-V channel layer 126 may be a 2-20 nm thick layer of indium gallium arsenide ($In_xGa_{(1-x)}As$), preferably, a 10 nm thick $In_{0.53}Ga_{0.47}As$ layer.

Figure 3:
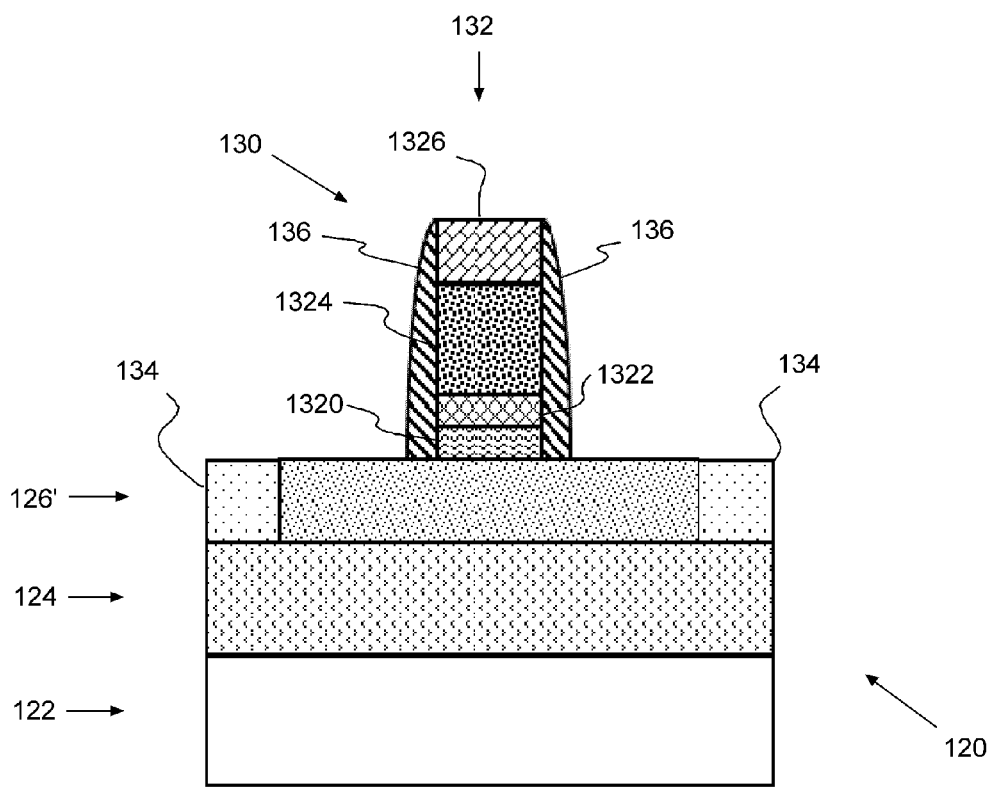
FIG. 3 shows a cross sectional example of a device location defined on the layered wafer.

FIG. 3 shows a cross sectional example of a device location 130 defined (104 in FIG. 1) on the layered wafer 120 of FIG. 2 with like features labeled identically. Each device location includes a gate stack 132 on the III-V channel layer 126. Insulating material 134, e.g., shallow trench isolation (STI) dielectric, isolates channel layer 126' in the device location 130 from adjacent devices (not shown). STI 134 may be formed before or after forming the gate stack 132, preferably before. Trenches are formed through the III-V channel layer 126 using any suitable well known mask and etch. Once formed, the trenches are filled with a suitable insulating material, e.g., oxide, and the layered wafer 120 is re-planarized, e.g., with a suitable chemical-mechanical polish (CMP).

The gate stack 132 in this example includes a gate dielectric layer 1320 beneath a metal gate layer 1322. An amorphous silicon layer 1324 is formed on the metal gate layer 1322, and a hard mask layer 1326 defines the gate stack 132. Gate sidewall spacers 136 define source/drain extensions between the gate stack 132 and intended layered source/drain regions.

In this example, the gate dielectric layer 1320 is a 0.5-2 nm thick high k dielectric layer, preferably a 1 nm thick, formed on the III-V channel layer 126. A 5-20 nm thick metal layer 1322, preferably a 10 nm thick layer of titanium nitride (TiN), tungsten (W) or copper (Cu) is formed, e.g., deposited, on the high k dielectric layer. Depositing silicon on the metal layer forms an amorphous silicon layer 1324. In this example, silicon is deposited to form a 5-50 nm thick amorphous silicon layer 1324, preferably a 20 nm thick layer. Preferably, the hard mask material is a 5-50 nm thick layer of a etch resistant oxide such as Hafnium oxide, nitride or any other material that is resistant to the III-V etchant.

The hard mask 1326 pattern may be formed using, for example, sidewall image transfer or lithography to mask and etch the hard mask 1326 into the layer. After forming the hard mask 1326 pattern, the gate 130 is defined by etching away excess silicon, metal and high-k dielectric layers. Since the hard mask 1326 layer is 5-50 nm thick layer, and preferably a 20 nm thick layer, any thickness that is removed during etching the much thinner metal and high-k dielectric layers is inconsequential. Gate sidewall spacers 136 may be formed by depositing a conformal sidewall material layer, e.g., a 2-10 nm thick nitride layer, preferably 5 nm thick, and etching directionally using, for example, a reactive ion etch (RIE).

Figure 4:
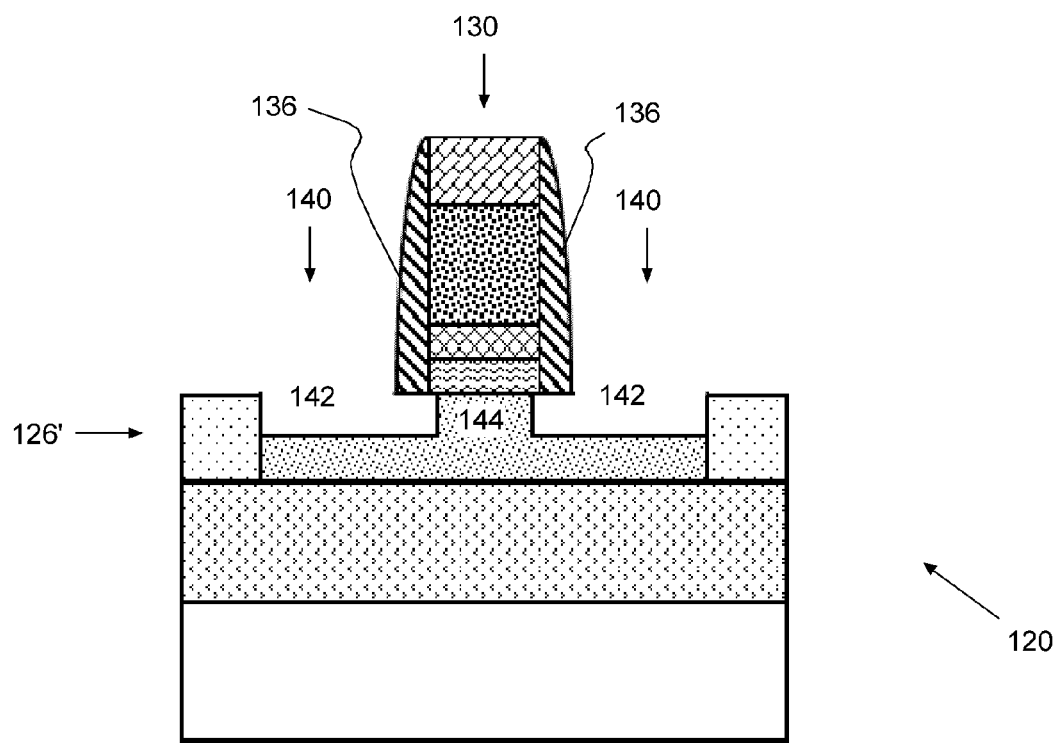
FIG. 4 shows a cross sectional example of the device location after sub-etching source/drain regions the channel layer.

FIG. 4 shows a cross sectional example of the device location 130 after sub-etching (106 in FIG. 1) source/drain regions 140 in the channel layer 126' in FIG. 3 with like features labeled identically. Preferably, after forming the gate sidewall spacers 136, the channel layer 126' is etched with a suitable non-directional etch, e.g., wet etch or a plasma etch, to recess the surface 2-10 nm, and preferably, 5 nm. The sub-etch opens pockets 142 under the gate sidewalls 136, and partially under the gate stack 132, 2-10 nm, preferably 5 nm, to define the device channel 144.

Figure 5:
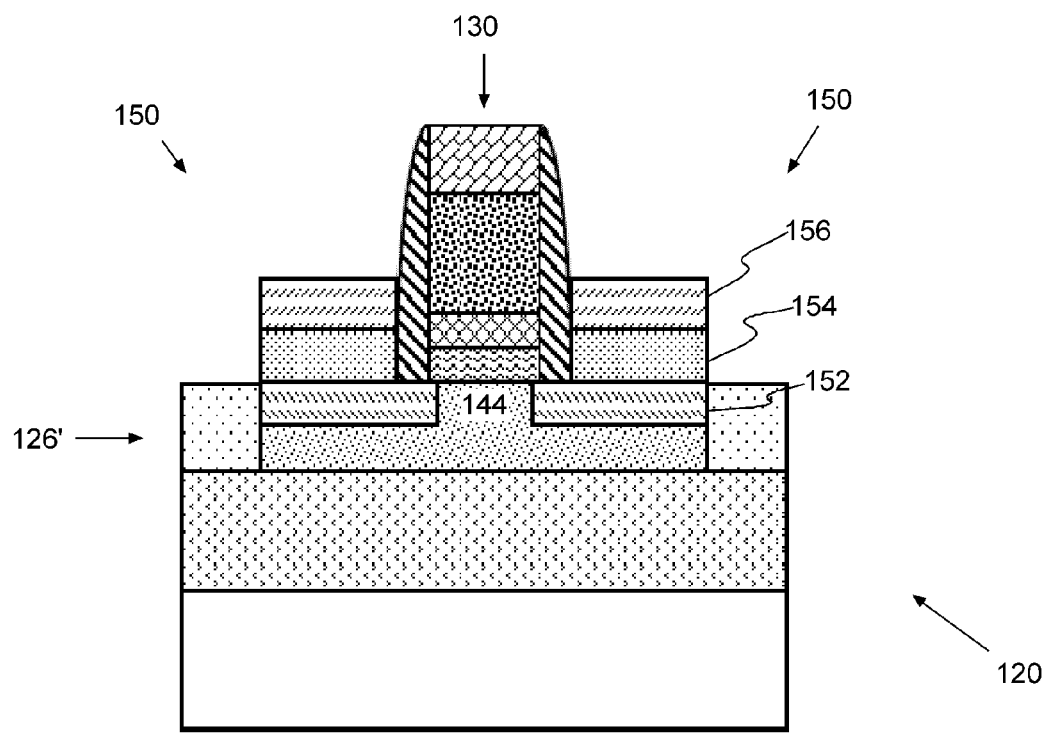
FIG. 5 shows a cross sectional example of the device location after forming raised source/drain regions adjacent to the channel.

FIG. 5 shows a cross sectional example of the device location 130 after forming (108 in FIG. 1) raised source/drain regions 150 adjacent to the channel 144 in FIG. 4 with like features labeled identically. The raised source/drain regions 150 are formed with a series of timed, selective epitaxial growths of three in-situ heavily-doped III-V layers 152, 154, 156. The first, bottom source/drain layer 152 is a III-V semiconductor material, e.g., $In_yGa_{(1-y)}As$, with high electron affinity and low electron effective mass (m*) as compared to channel 144. For example, bottom layer 152 may be an $In_{0.7}Ga_{0.3}As$ layer for an $In_{0.53}Ga_{0.47}As$ channel layer 126'. The selected materials typically exhibit a lattice mismatch between bottom source/drain layer 152 and channel layer 126'. Because of this lattice mismatch, the bottom source/drain layer 152 should be thin, typically, no more than 10 nm and, preferably, 5 nm.

The middle layer 154 is a 10-30 nm thick, and preferably a 20 nm thick, III-V semiconductor layer. In this example, middle layer 154 is of the same material as the channel 144, e.g., $In_{0.53}Ga_{0.47}As$. Thus, the middle layer 154 is lattice-matched to the channel 144. Finally, the top layer 156 is typically no more than 10 nm thick, and preferably a 5 nm thick, III-V semiconductor layer with high electron affinity to obtain a low barrier height for a subsequently formed metal contact. The top layer 156 material may be different than, or the same as, the middle layer 154, e.g., $In_{0.7}Ga_{0.3}As$ or $In_{0.53}Ga_{0.47}As$.

Figure 6:
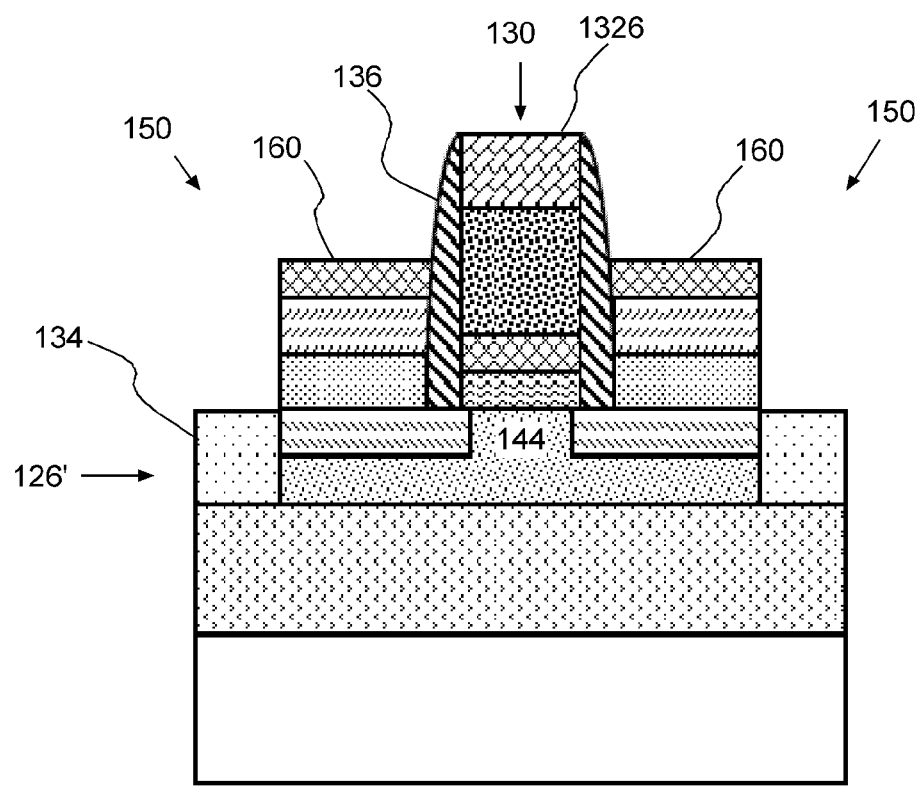
FIG. 6 shows a cross sectional example of the device location after forming metal contacts to the raised source/drain regions.

FIG. 6 shows a cross sectional example of the device location 130 after forming (110 in FIG. 1) metal contacts 160 to the raised source/drain regions 150 in FIG. 5 with like features labeled identically. Each of the metal contacts 160 may be a 5-20 nm thick, and preferably a 10 nm thick, layer of a suitable metal-III-V alloy, e.g., Ni—InGaAs or Ti—InGaAs. Self-aligned metal-III-V alloy contacts may be formed by first a blanket deposit of a suitable metal. Annealing the wafer at 300-500° C. for 5-60 seconds forms the metal-III-V alloy in raised source/drain regions 150. A selective wet etch removes unreacted metal atop the hard mask 132b, gate sidewall spacers 136, and STI 134. Typical such metal to contact to $In_{0.53}Ga_{0.47}As$ exhibit contact resistivity in $10^{-7}$-$10^{-9}$ ohm-$cm^2$ range, minimizing series external resistance ($R_{EXT}$) penalties. Once the self-aligned contacts 160 are formed on the raised source/drain regions 150, fabrication continues normally, forming a interlevel dielectric (ILD) layer (not shown) on the wafer 120 and wiring layers connecting devices 130 together into circuits and connecting circuits off chip.

Figure 7:
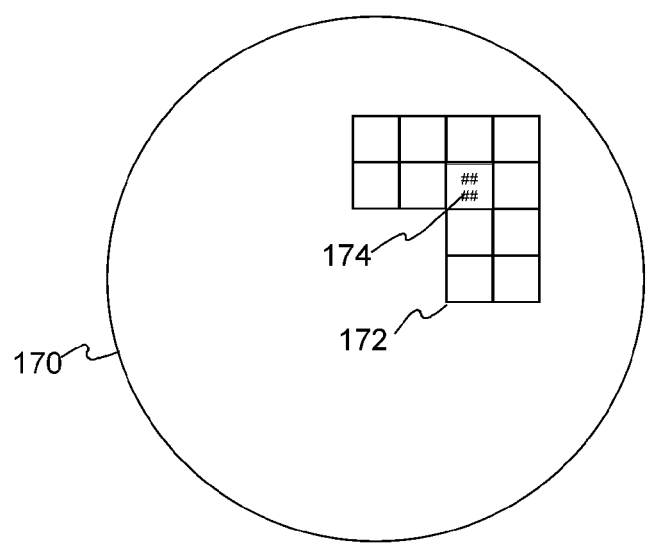
FIG. 7 shows an example of a wafer with chips manufactured according to a preferred embodiment of the present invention.

FIG. 7 shows an example of a wafer 170 with chips 172 manufactured according to a preferred embodiment of the present invention. Metal lines on upper layers (not shown) wire chip FETs into chip circuits 174 and chip circuits 174 together. One or more of the connected circuits 174 includes at least one preferred FET.

Thus advantageously, since the bottom source/drain layer material has a high electron affinity and low electron effective mass (m*) compared to the channel layer, the source/drain regions are further depleted of electrons. Electron transfer from the bottom source/drain layer to channel is increased as compared to prior devices with uniform material forming the source/drain regions and channel material. Therefore, for the same physical channel length ($L_G$), preferred devices have a longer effective channel length ($L_{EFF}$) for improved short-channel effects, e.g., reduced drain-induced barrier lowering (DIBL) and reduced off-current ($I_{off}$). Further, the preferred top layer material has an electron affinity close to that of the contact metal to minimize the Schottkey barrier height (SBH) at the metal/semiconductor interface, while minimizing series external resistance ($R_{EXT}$) penalties.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A method of forming Field Effect Transistors (FETs), said method comprising:

defining FET locations in a surface layer of a layered semiconductor wafer, wherein said surface layer is a III-V semiconductor layer;

forming a gate stack on each FET location;

sub-etching source/drain regions at each said gate stack, the sub-etched source/drain regions defining a channel under each said gate stack; and forming a layered source/drain in each sub-etched source/drain region, forming said layered source/drain region comprising:

growing a first III-V semiconductor layer in said sub-etched source/drain regions, growing a second III-V semiconductor layer on said first III-V semiconductor layer, said second III-V semiconductor layer being lattice-matched to said channel, and growing a third III-V semiconductor layer on said second III-V semiconductor layer.

2. A method of forming FETs as in claim 1, wherein defining FET locations comprises isolating said each FET location with shallow trench isolation.

3. A method of forming FETs as in claim 2, wherein forming said gate stack comprises:

forming a gate dielectric layer on said surface layer;

forming a first conductive layer on said gate dielectric layer;

forming a second conductive layer on said first conductive layer;

forming a mask pattern on said second conductive layer;

patterning said gate dielectric layer, said first conductive layer and said second conductive layer to said mask pattern, wherein patterning defines a layered gate stack at said each FET location; and forming gate sidewalls alongside each said layered gate stack.

4. A method of forming FETs as in claim 1, wherein growing said first III-V semiconductor layer, said second III-V semiconductor layer and said third II-V semiconductor comprises epitaxially growing each layer in-situ doped.

5. A method of forming FETs as in claim 1, wherein said channel and said second III-V semiconductor layer are the same III-V semiconductor.

6. A method of forming FETs as in claim 1, wherein said channel and said second III-V semiconductor layer are indium gallium arsenide ($In_xGa_{(1-x)}As$) and said first III-V semiconductor layer is $In_yGa_{(1-y)}As$.

7. A method of forming FETs as in claim 6, wherein said third III-V semiconductor layer is $In_yGa_{(1-y)}As$.

8. A method of forming FETs as in claim 6, wherein x=0.53 and y=0.7.

9. A method of forming FETs as in claim 1, wherein forming said layered source/drain further comprises forming a self-aligned metal contact to each said layered source/drain.

10. A method of forming FETs as in claim 1, wherein said FETs are FETs in an Integrated Circuit (IC) chip, and said method further comprises forming chip wiring connecting said FETs into chip circuits and connecting said chip circuits together.

11. A Field Effect Transistor (FET) comprising:

a island in a channel layer of a layered wafer, said channel layer being a III-V semiconductor surface;

a gate stack above a channel region in said island, said channel layer being recessed at each end of said channel region; and a layered III-V semiconductor source/drain region adjacent each end of said channel region, each said layered III-V semiconductor source/drain comprising:
   a first III-V semiconductor layer in a recess in said channel layer at said each end,
   a second III-V semiconductor layer on said first III-V semiconductor layer, said second III-V semiconductor layer being lattice-matched to said channel, and
   a third III-V semiconductor layer on said second III-V semiconductor layer.

12. A FET as in claim 11, wherein said layered wafer comprises:
   a semiconductor substrate;
   a III-V semiconductor bottom barrier layer on said semiconductor substrate;
   a III-V semiconductor channel layer on said III-V semiconductor bottom barrier layer, wherein shallow trench isolation dielectric defines said island in said III-V semiconductor channel layer.

13. A FET as in claim 11, wherein said gate stack comprises:
   a high-k gate oxide on said channel;
   a conductive gate layer on said high-k gate oxide;
   a semiconductor gate layer on said conductive gate layer;
   a dielectric cap on said semiconductor gate layer; and
   a dielectric sidewall spacer on along each end of said gate, the bottom layer of each said layered III-V semiconductor source/drain region extending under a respective said dielectric sidewall to said channel region.

14. A FET as in claim 11, wherein said channel and said second III-V semiconductor layer are indium gallium arsenide ($In_xGa_{(1-x)}As$) and said first III-V semiconductor layer is $In_yGa_{(1-y)}As$.

15. A FET as in claim 14, wherein x=0.53 and y=0.7 and said third III-V semiconductor layer is $In_{0.7}Ga_{0.3}As$.

16. An Integrated Circuit (IC) chip including a plurality of FETs as in claim 11, wherein said layered source/drain further comprises a self-aligned metal contact to each said layered source/drain, and said IC chip further comprises chip wiring connecting said FETs into chip circuits and connecting said chip circuits together.

17. An Integrated Circuit (IC) chip comprising:
   a semiconductor substrate;
   a III-V semiconductor bottom layer on said semiconductor substrate;
   a III-V semiconductor surface channel layer;
   a plurality of Field Effect Transistors (FETs) on the surface channel layer connected into a plurality of IC chip circuits, one or more of said FETs comprising:
      a device island in said channel layer, shallow trench isolation through said channel layer defining each said device island,
      a gate stack on a channel in said device island, said device island being recessed to said channel,
      a dielectric sidewall spacer on along each end of said gate,
      a first III-V semiconductor source/drain layer adjacent each end of said channel region in a respective island recess, each said dielectric sidewall extending alongside a respective gate from said first III-V source/drain semiconductor source/drain layer,
      a second III-V source/drain semiconductor layer on said first III-V source/drain semiconductor layer, said second III-V source/drain semiconductor layer being lattice-matched to said channel,
      a third III-V source/drain semiconductor layer on said second III-V source/drain semiconductor layer, and
      a source/drain contact to each said third source/drain III-V semiconductor layer; and
   one or more wiring layers, at least one wiring layer connecting to FET source/drain contacts, wiring in said wiring layers further connecting said FETs into said plurality of IC chip circuits.

18. An IC chip as in claim 17, wherein said III-V semiconductor bottom barrier layer is indium aluminum arsenide (InAlAs), said channel and said second III-V source/drain semiconductor layer are indium gallium arsenide ($In_{0.53}Ga_{(1-0.47)}As$) and said first III-source/drain V semiconductor layer is $In_{0.7}Ga_{0.3}As$.

19. A Field Effect Transistor (FET) comprising:
   a island in a channel layer of a layered wafer, said channel layer being a III-V semiconductor surface, said layered wafer comprising:
      a semiconductor substrate,
      a III-V semiconductor bottom barrier layer on said semiconductor substrate, and
      a III-V semiconductor channel layer on said III-V semiconductor bottom barrier layer, wherein shallow trench isolation dielectric defines said island in said III-V semiconductor channel layer;
   a gate stack above a channel region in said island, said channel layer being recessed at each end of said channel region; and
   a layered III-V semiconductor source/drain region adjacent each end of said channel region.

20. A Field Effect Transistor (FET) comprising:
   a island in a channel layer of a layered wafer, said channel layer being a III-V semiconductor surface;
   a gate stack above a channel region in said island, said channel layer being recessed at each end of said channel region, said gate stack comprising:
      a high-k gate oxide on said channel,
      a conductive gate layer on said high-k gate oxide,
      a semiconductor gate layer on said conductive gate layer,
      a dielectric cap on said semiconductor gate layer, and
      a dielectric sidewall spacer on along each end of said gate, the bottom layer of each said layered III-V semiconductor source/drain region extending under a respective said dielectric sidewall to said channel region; and
   a layered III-V semiconductor source/drain region adjacent each end of said channel region.

* * * * *